US006772620B1

(12) United States Patent
Poris

(10) Patent No.: US 6,772,620 B1
(45) Date of Patent: Aug. 10, 2004

(54) METHOD OF GENERATING CALIBRATION DATA FOR RELATIVE HEIGHT MEASUREMENT

(75) Inventor: Jaime Poris, Los Gatos, CA (US)

(73) Assignee: Nanometrics Incorporated, Milpitas, CA (US)

(*) Notice: Subject to any disclaimer, the term of this patent is extended or adjusted under 35 U.S.C. 154(b) by 0 days.

(21) Appl. No.: 10/315,438

(22) Filed: Dec. 9, 2002

Related U.S. Application Data

(62) Division of application No. 09/636,264, filed on Aug. 10, 2000, now Pat. No. 6,568,290.

(51) Int. Cl.[7] .......................... G01B 11/14; G01B 11/00
(52) U.S. Cl. ....................... 73/1.81; 250/252.1; 702/97
(58) Field of Search .................... 73/1.81, 1.79, 73/866, 86, 7; 702/97; 250/252.1; 356/511, 625; 438/7, 14, 16–18

(56) References Cited

U.S. PATENT DOCUMENTS

| | | | |
|---|---|---|---|
| 4,047,427 A | * 9/1977 | Young | 73/862.041 |
| 4,284,950 A | * 8/1981 | Burl et al. | 324/320 |
| 4,512,661 A | 4/1985 | Claus et al. | 356/351 |
| 4,787,098 A | * 11/1988 | Silver | 378/18 |
| 5,314,843 A | 5/1994 | Yu et al. | 538/692 |
| 5,348,002 A | 9/1994 | Caro | 356/39 X |
| 5,555,471 A | 9/1996 | Xu et al. | 356/504 |
| 5,604,591 A | 2/1997 | Kitagawa | 356/351 |

(List continued on next page.)

FOREIGN PATENT DOCUMENTS

| | | | |
|---|---|---|---|
| EP | 0 831 295 A1 | 3/1998 | G01B/9/02 |
| EP | 0 982 774 A2 | 3/2000 | H01L/23/498 |
| WO | WO 00/54325 | 9/2000 | H01L/21/66 |

OTHER PUBLICATIONS

Brain E. Stine et al., "Rapid Characterization and Modeling of Pattern–Dependent Variation in Chemical Polishing", IEEE Transactions on Semiconductor Manufacturing, VOL> 11, No.1, Feb. 1998, pp 129–140.

Malacara, Daniel et al. "Interferogram Analysis For Optical Testing" 1998, Marcel Dekker, Inc. pp. 113, month not given.

(List continued on next page.)

*Primary Examiner*—Thomas P. Noland
(74) *Attorney, Agent, or Firm*—Silicon Valley Patent Group LLP

(57) ABSTRACT

A metrology process, in accordance with the present invention, measures the dishing of a first feature made of a first material by determining the relative height of the first feature with respect to a second feature, where the first and second features have different dishing rates. The relative height of the first feature with respect to the second feature may be determined by measuring a first relative height of the first feature with respect to a reference location, measuring a second relative height of the second feature with respect to a reference location, and calculating the difference between the first and second relative heights. Alternatively, other methods may be used. The relative height is then correlated with calibration data to determine the amount of dishing of the first feature. The calibration data is generated by first providing a sample substrate with features approximately the same as the substrate to be measured, e.g., first and second calibration features of similar dishing rates as first and second features on a production substrate. The sample substrate is then processed to produce dishing of the first and second calibration features. Subsequently, the actual dishing of the first and second calibration features is measured, and the difference in dishing between the first and second calibration features calculated. The calibration data is then produced by relating the difference in dishing between the first and second calibration features to the actual dishing of the first calibration feature.

13 Claims, 8 Drawing Sheets

U.S. PATENT DOCUMENTS

| | | | |
|---|---|---|---|
| 5,784,163 A | 7/1998 | Lu et al. | 356/351 |
| 5,872,629 A | 2/1999 | Colvard | 356/349 |
| 5,874,318 A | 2/1999 | Baker et al. | 438/8 |
| 5,914,782 A | 6/1999 | Sugiyama | 356/351 |
| 5,953,115 A | 9/1999 | Landers et al. | 356/237 |
| 5,964,265 A * | 10/1999 | Becherer | 152/152.1 |
| 5,983,167 A | 11/1999 | Ebisawa | 702/167 |
| 6,194,317 B1 | 2/2001 | Kaisaki et al. | 438/692 |
| 6,238,592 B1 | 5/2001 | Hardy et al. | 438/692 X |
| 6,340,602 B1 | 1/2002 | Johnson et al. | 438/7 |
| 6,392,749 B1 | 5/2002 | Meeks et al. | 356/681 |
| 6,392,752 B1 | 5/2002 | Johnson | 356/511 |
| 6,568,290 B1 | 5/2003 | Poris | 73/866 |
| 6,700,670 B1 * | 3/2004 | Poris | 356/625 |
| 2002/0174714 A1 | 11/2002 | McWaid et al. | 73/105 |

OTHER PUBLICATIONS

Makosch, G., "LASSI—a scanning differential ac interferometer for surface profile and roughness measurement" SPIE vol. 1009, (1988); pp. 244–253, month not given.

Assam, R. "Ellipsometery and Polarized Light", *Elsevier Science* B.V. (1977, 1987), pp. 282–287, month not given.

Fujiwara, J et al., "Dept–profiles in compositionally–graded amorphous silicon alloy thin films analyzed by real time spectroscopic ellipsometry", *Elsevier Science SA*, pp. 474–478 (1998), by May.

Heavens, O.S. "Optical Properties of Thin Film Solid Films" *Dover Publications, Inc.* 1991) pp. 62–73, month not given.

Jennewin, H. et al., "Interferometrical Profilometry at Surfaces with Varying Materials" *SPIE vol. 3677* (1999), pp. 1009–1016, month not given.

Kildemo, M. et al., "Measurement of the absorption edge of thick transparent substrates using the incoherent reflection model and spectroscopic UV—visible—near IR ellipsometry" *Elsevier Science S.A.* pp. 108–113 (1998), Feb.

Kim, Gee–Hong et al., "White light scanning interferometry for thickness measurement of thin film layers" *SPIE vol. 3783* (1999), pp. 239–246, published Nov., presented July.

Makosch, G. et al., "Surface profiling by electro–optical phase measurements" *SPIE vol. 316* (1981); pp. 42–53, month not given.

Numerical Recipes, The art of Scientific Computing by Press, Flannery, Teukolsky and Vetterling, published by Cambridge University Press (1988), 3.2 Rational Function Interpolation and Extrapolation, pp. 83–85, no month given.

* cited by examiner

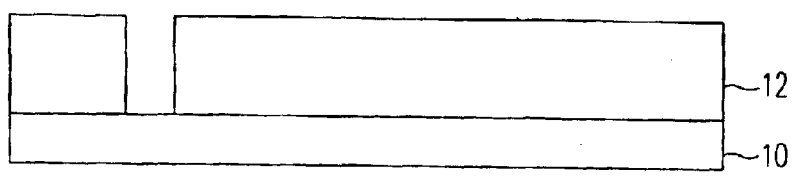
FIG. 1A
(Conventional)
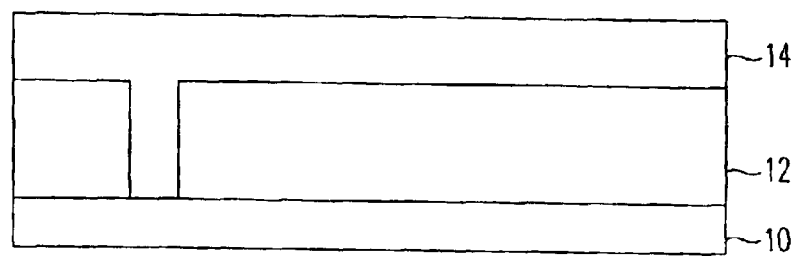
FIG. 1B
(Conventional)
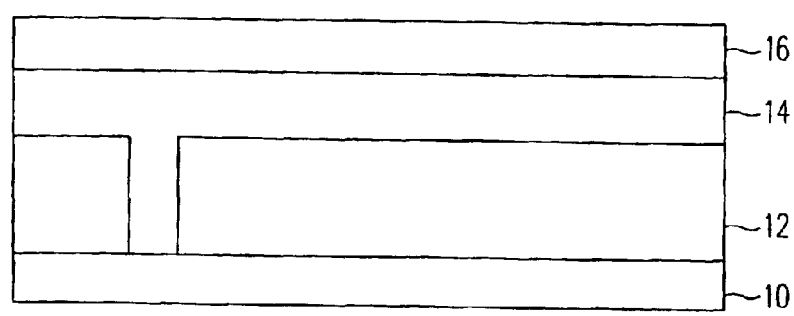
FIG. 1C
(Conventional)
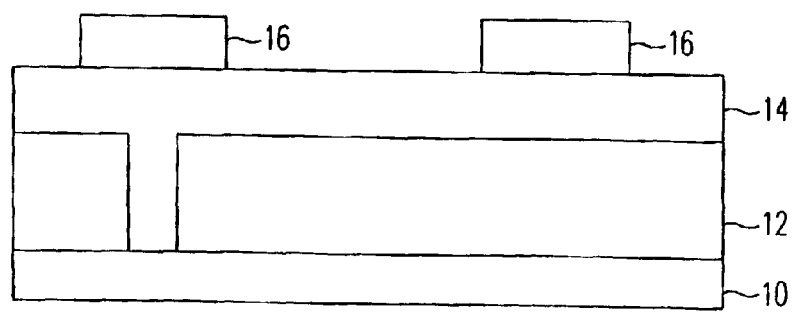
FIG. 1D
(Conventional)
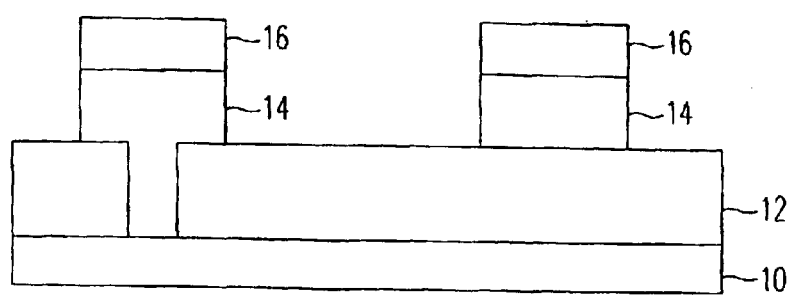
FIG. 1E
(Conventional)

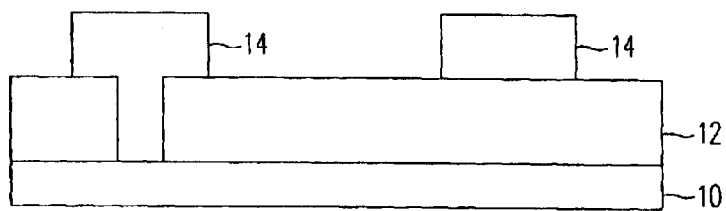
FIG. 1F
(Conventional)
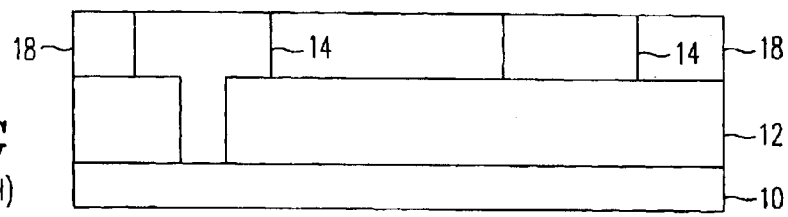
FIG. 1G
(Conventional)
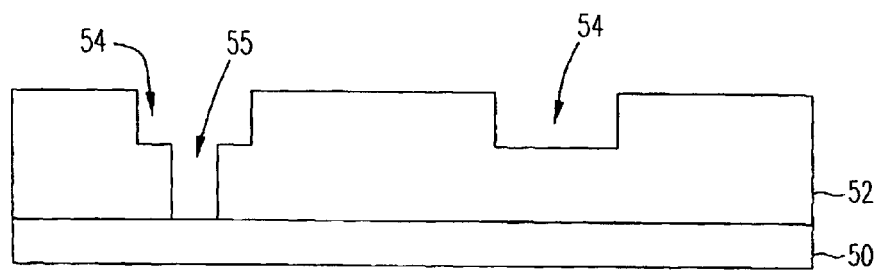
FIG. 2A
(Conventional)
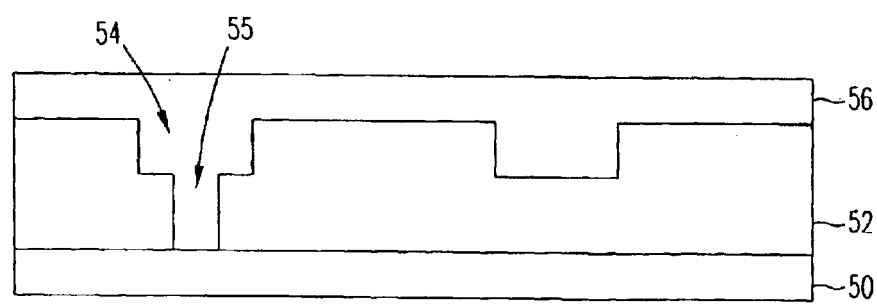
FIG. 2B
(Conventional)
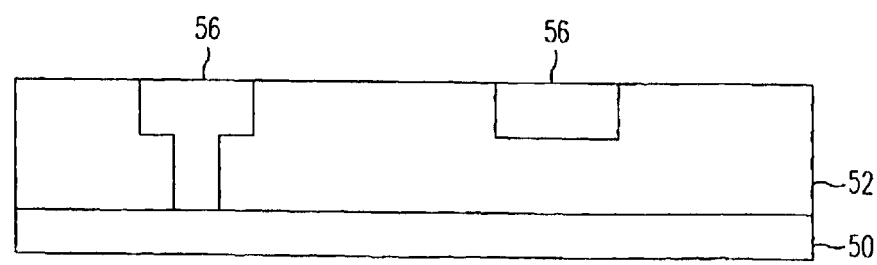
FIG. 2C
(Conventional)

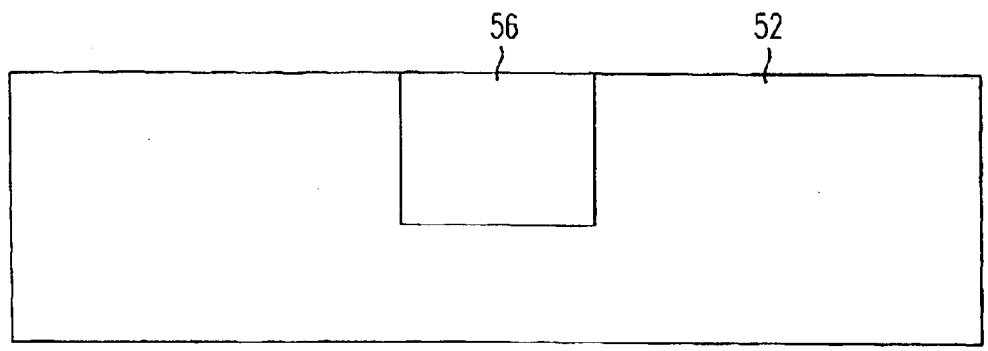
FIG. 3
(Conventional)
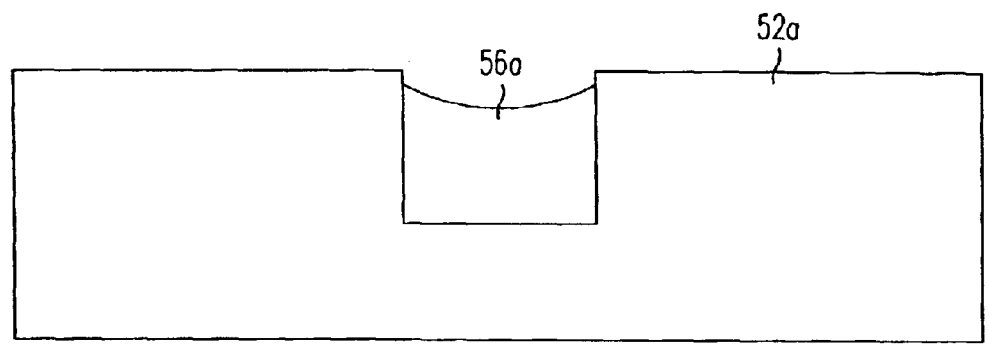
FIG. 4
(Conventional)

US 6,772,620 B1

METHOD OF GENERATING CALIBRATION DATA FOR RELATIVE HEIGHT MEASUREMENT

CROSS REFERENCE TO RELATED APPLICATION

This application is a divisional of U.S. patent application Ser. No. 09/636,264, filed Aug. 10, 2000, now U.S. Pat. No. 6,568,290, entitled "Method of Measuring Dishing Using Relative Height Measurement".

FIELD OF THE INVENTION

The present invention relates to measuring the surface profile properties of opaque features, and in particular to a metrology procedure to measure dishing that occurs in opaque features surrounded by dielectric features, e.g., after a chemical-mechanical polishing (CMP) step.

BACKGROUND

The metal interconnect of integrated circuits has conventionally been realized by blanket depositing a layer of metal on a planar insulating surface. Portions of the metal layer are subsequently removed in a photolithographically patterned etching step to form the resulting metal conductors. Conventional integrated circuits have generally employed somewhat resistive metal, such as aluminum, or metal alloys for the metal interconnect. Copper has been chosen as a replacement metal for aluminum in smaller geometry devices. Due to complexities associated with etching copper, it must be patterned in a different manner. Copper is blanket deposited over the wafer that has trenches and vias etched into the dielectric and then it is subjected to chemical mechanical polishing (CMP) to remove the copper from the upper planar surface. The goal is to have a globally planar surface composed of copper and dielectric regions.

FIGS. 1A through 1G show a cut-away view of the conventional fabrication of an aluminum interconnect. As shown in FIG. 1A, a relatively planar surface layer 10, which maybe, e.g., a silicon substrate, is covered with a dielectric layer 12, e.g., an oxide layer, which is patterned and etched. An aluminum layer 14, which may be an aluminum alloy, is blanket deposited over the dielectric layer 12, as shown in FIG. 1B. A photoresist layer 16 is deposited over the aluminum layer 14 (FIG. 1C), and is exposed and developed resulting in the structure shown in FIG. 1D. The aluminum layer 14 is then etched, e.g., using a plasma etching technique, resulting in the structure shown in FIG. 1E. The remaining photoresist layer 16 is removed resulting in the structure shown in FIG. 1F. After these steps are completed, the surface is composed of metal lines with near vertical sidewalls above the surface of the dielectric layer 12, as shown in FIG. 1F. Subsequently, dielectric layers are deposited and etched over the metal lines to yield a dielectric layer 18 with a planarized surface, e.g., for the next metal layer, as shown in FIG. 1G.

A major change is being implemented in semiconductor processing by switching from aluminum to copper metallization. Copper is preferred to aluminum due to its lower resistivity and better electromigration resistance. Unfortunately, copper is difficult to etch and the switch from aluminum to copper has forced a change in the basic metallization process. Copper cannot simply be substituted for aluminum in the metallization process because plasma etching of copper is more difficult than plasma etching of aluminum (due to the lack of volatile copper halogen compounds). Additionally, if copper is allowed to directly contact the dielectric materials, it can rapidly diffuse through dielectric materials and contaminate the semiconductor devices.

Thus, a "damascene" process has been developed whereby copper can be used as the interconnect metal. Rather than blanket depositing the interconnect metal on a substantially planar insulating substrate and then etching away parts of the metal layer to leave the conductors, trenches are formed in an insulating material. A composite layer of a diffusion barrier, nucleation layer and copper are then blanket deposited over the entire surface of the insulating substrate such that the trenches are filled. Chemical mechanical polishing is then used to planarize the integrated circuit surface and thereby polish away all the metal that is not in the trenches. The result is metal conductors disposed in trenches and a globally planarized surface.

FIGS. 2A through 2C show a cut-away view of the conventional fabrication of a copper interconnect. As shown in FIG. 2A, a relatively planar surface layer 50, which may be, e.g., a silicon substrate, is covered with a dielectric layer 52, e.g., an oxide layer, which is patterned and etched. The dielectric layer 52 may be patterned and etched in multiple steps in order to produce trenches 54 and via 55. A diffusion barrier layer (not shown), nucleation layer (not shown), and copper layer 56 are blanket deposited over the dielectric layer 52 such that the trenches 54 and via 55 are filled, as shown in FIG. 2B. A chemical mechanical polishing step is then used to planarize the surface of the copper layer 56 (along with the diffusion barrier layer and nucleation layer) with dielectric layer 52, resulting in the structure shown in FIG. 2C.

The ideal copper CMP process removes the copper, nucleation layer and diffusion barrier from the surface of the dielectric while leaving behind the copper, nucleation layer and diffusion barrier in the trenches and contacts or vias. The ideal result would be a globally planarized surface with no vertical height change over the entire wafer surface. FIG. 3 shows the ideal resulting structure with a planar surface composed of a dielectric region 52 and idealized copper region 56. Global planarity is desirable because of the depth of field requirements associated with the lithographic steps. Significant height variations on the surface will compromise the photoresist processing steps and subsequently the etching and metallization processes. Height variations are also symptomatic of undesirable variations in the copper thickness and metal line resistance.

Unfortunately, because of the complexities associated with the CMP process, global planarity is not achievable. An artifact of the CMP processes in copper metallization results from the copper and dielectric material having different polishing rates, resulting in what is known as "dishing." FIG. 4 shows a cut-away side view of the typical resulting structure after the CMP process, in which the surface of the copper region 56a is lower than the surrounding dielectric region 52a. It should be understood that FIG. 4 is for exemplary purposes and is not to scale. Dishing may generally be defined as the maximum height difference between the metal region 56a and the adjacent dielectric region 52a after CMP processing.

Another artifact caused by the CMP process, as known to those of ordinary skill in the art, is "dielectric erosion," i.e., the dielectric regions exhibit a change in height over the surface of the wafer. This variation is related to the local density of metal features. Areas of low metal density exhibit the highest dielectric surface regions whereas areas of high metal density result in lower dielectric surface regions. Dielectric erosion, however, is beyond the scope of this disclosure.

The processing of silicon wafers to form integrated circuit chips requires many complex processing steps. Each step must be carefully monitored and controlled to maximize the quality and yield of the final product. With the imminent replacement of aluminum by copper to form the metallization layers on silicon wafers, new processes and metrology techniques must be developed and implemented to characterize the degree of surface planarization after the CMP step.

Accordingly, what is needed is an economical, reliable, rapid, precise and accurate metrology procedure that will characterize and control the individual process steps in the copper metallization process and specifically that will address dishing that results from certain polishing methods, such as the CMP process.

SUMMARY

A metrology process, in accordance with the present invention, measures the dishing of a first feature made of a first material, e.g., an opaque or metal line, that is surrounded by a second material, e.g., a transparent material or dielectric layer, on a production substrate using calibration data. This is done by determining the relative height of the first feature with respect to a second feature where the first feature and the second feature have different dishing rates. The relative height of the first feature with respect to a second feature is then correlated with calibration data to determine the amount of dishing of the first feature. The first and second features can be made of a first material, for example, a metal or metal alloy line containing, e.g., copper, aluminum, or tungsten, while the second material can be a dielectric material. The metrology process is useful, for example, after the metal and dielectric materials undergo a planarization process, e.g., CMP, to approximately planarize the surface of the production substrate. The method utilizes a set of calibration data that correlates the difference in dishing between a first and second feature with the dishing of the first feature. Different sets of calibration data may be utilized based on different parameters used in the planarization process, e.g., a CMP process. It is preferred that the same CMP parameters be used on the calibration samples and the production samples and that the calibration samples have features with approximately the same dishing rates as the features on the production samples.

Determining the relative height of the first feature with respect to the second feature may be done by measuring a first relative height of the first feature with respect to a reference location, measuring a second relative height of the second feature with respect to a reference location and calculating the difference between the first and second relative heights. The composition and thickness of the reference locations must be identical. Any differences in the reference locations will result in measurement errors. The measurements may be at single points, multiple points on a line, or multiple points covering an area. Relative heights are measured using an appropriate metrology device, e.g., a differential interferometer or a laser displacement sensor. The difference between the first and second relative heights, is the relative height of the first feature with respect to the second feature. Additionally, other methods may be used to determine the relative height of the first feature with respect to the second feature, such as directly measuring the relative height of the first feature with respect to the second feature.

The calibration data is produced by initially providing a sample substrate having first and second calibration features that are similar to the features to be measured on the production substrate. The sample substrate is processed in a manner similar to that of the production substrate to produce dishing in the first and second calibration features. Thus, for example, the sample substrate is planarized using a CMP process. The actual dishing of the first and second calibration features is then measured using, e.g., an atomic force microscope, a contact profilometer, or another appropriate device. The difference in dishing between the two calibration features can then be calculated. Finally, the calibration data is produced by relating the difference in dishing between the two calibration features to the actual dishing of the first calibration feature. Additional sets of calibration data may be generated using different parameter settings for the planarization process, e.g., a CMP process. The calibration data for the dishing of the second feature can also be produced by relating the difference in dishing between two calibration features to the actual dishing of the second calibration feature, if desired.

In another embodiment of the present invention, the calibration data is generated in a similar manner, but using a differential interferometer. The sample substrate is processed in a manner similar to that of the production substrate to produce dishing in the first and second calibration features. The sample substrate is then coated with an adequate layer of an opaque material, e.g., 40 nm of platinum. The amount of dishing is not modified by the addition of the opaque material film. Additionally, the opaque film eliminates the phase difference between the high and low regions simplifying the differential interferometer reading. A differential interferometer can then directly measure the actual dishing of the first and second calibration features. The difference in dishing between the two calibration features is then calculated, and calibration data is produced as described.

BRIEF DESCRIPTION OF THE DRAWINGS

FIGS. 1A through 1G show a cut-away view of the conventional fabrication of an aluminum interconnect.

FIGS. 2A through 2C show a cut-away view of the conventional fabrication of a copper interconnect.

FIG. 3 shows a cut-away view of the ideally planar metal and dielectric regions resulting from a planarization process.

FIG. 4 shows a cut-away view of the typical resulting structure after a CMP process showing dishing of the metal region.

DETAILED DESCRIPTION

A metrology process, in accordance with the present invention, measures the amount of dishing of a feature on the surface of a flat substrate by determining the relative height of one feature with respect to a second feature, and using calibration data to correlate the relative height of one feature with respect to a second feature to the actual amount of dishing. This method is useful on substrates composed of more than one material, such as a metal (or metal alloy) and a dielectric material, and may be used for semiconductor wafers, flat panel displays, or other similar flat substrates. The present metrology procedure can quantify dishing after a planarization process, e.g., a CMP process, in a fast, precise, accurate, reliable and economical manner.

While it is preferred to directly measure the actual height difference between the metal and adjacent dielectric regions to quantify the dishing, direct measurement of the surface height of the copper feature and the dielectric feature with a form of radiation is difficult because these two materials respond in a complex manner to radiation. The copper material is essentially opaque to most forms of radiation and produces a material specific phase shift, while the dielectric material is partially transparent to most forms of radiation that are used for measurement purposes and also modifies the phase response in a complex manner. Layers or features buried in the dielectric layer may also interfere with reflected signals making analysis of the dielectric surface difficult. A detailed measurement using, e.g., an ellipsometer, is necessary to understand the complex modifications of the phase shift of the dielectric material. Metrology processes that may be used to measure the surface height of the dielectric region, however, are unsatisfactory due to cost, throughput and/or performance factors. Accordingly, only the relative heights are measured to quantify dishing in accordance with the present invention, which advantageously avoids complexities associated with measuring the reflected signal from both a transparent dielectric surface and an opaque surface. Preferably, the dielectric region adjacent to the opaque area to be measured must be of a constant thickness. This results in a constant (but unknown) phase shift associated with the dielectric.

Figure 5:
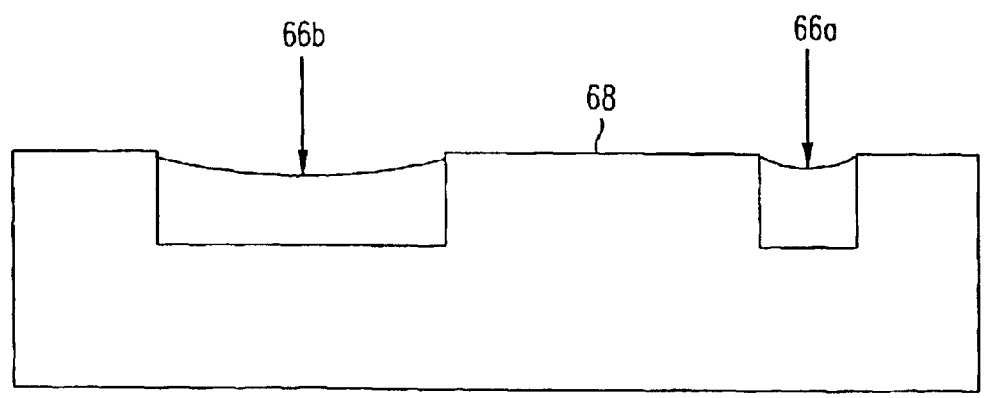
FIG. 5 shows a cut-away view of the typical resulting structure after a CMP process showing a profile of the dishing of a narrow, isolated metal line and a wide, isolated metal line.

FIG. 5 shows a cut-away view of the typical resulting structure after a CMP process showing a profile of the dishing of a narrow, isolated metal line 66a and a wide, isolated metal line 66b. As shown in FIG. 5, the magnitude of dishing increases with the size of the metal feature. The greatest amount of dishing occurs at the center of the metal features 66a and 66b, i.e., the maximum distance from the surrounding dielectric area, while the least amount of dishing occurs adjacent to the dielectric region 68. Consequently, the surfaces of the metal features 66a and 66b form a complex, concave shape. As can be seen in FIG. 5, a wide line 66b will have a greater amount of dishing than a narrow line 66a. Further, if the width of the line is sufficiently narrow, there will be minimal dishing observed. Thus, dishing is a function of the parameters associated with the CMP process as well as the line width. In addition, dishing is affected by the composition of the features. Thus, if line 66a and 66b are comprised of different material, they will dish at different rates.

Figure 6:
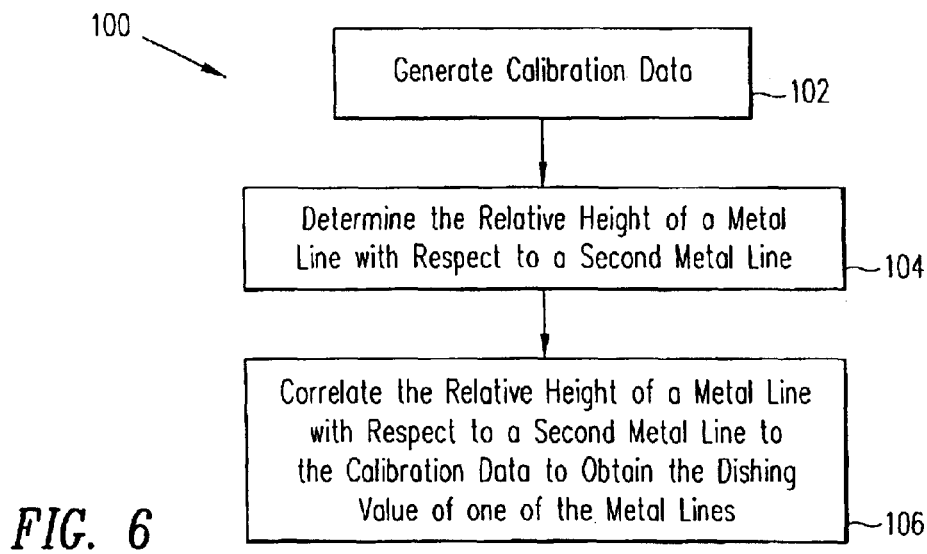
FIG. 6 is a flow chart describing the metrology process of the present invention.

The metrology process, in accordance with the present invention, measures the amount of dishing of a first feature, referred to for the sake of simplicity as a metal line, by using the relative height of the metal line with respect to a second feature, again referred to for the sake of simplicity as another metal line, and correlating the relative height of the metal line with respect to a second feature to calibration data to obtain the dishing value of the first metal line. FIG. 6 is a flow chart 100 describing the metrology process of the present invention. As shown in FIG. 6, calibration data is generated (block 102). The calibration data is used to correlate the relative height of a first metal line with respect to a second metal line with the dishing of at least one of the two metal lines. The calibration data could be generated using an atomic force microscope, contact profilometer or differential interferometer to measure a wafer that was processed with a known set of CMP parameters. Generating the calibration data is discussed in more detail below in reference to FIG. 8. The calibration data may be stored, e.g., in a database, and accessed during the metrology process.

Figure 7A:
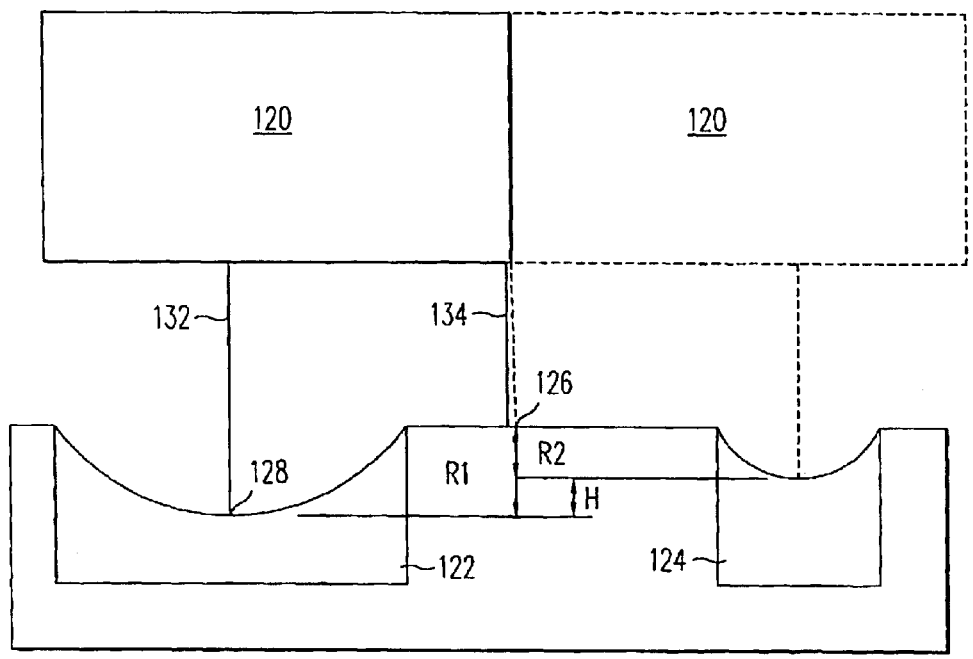
FIGS. 7A through 7C show a metrology device talking relative height measurements on a substrate with the typical resulting structure after a CMP process showing dishing of a narrow, isolated metal line and a wide, isolated metal line.
Figure 7B:
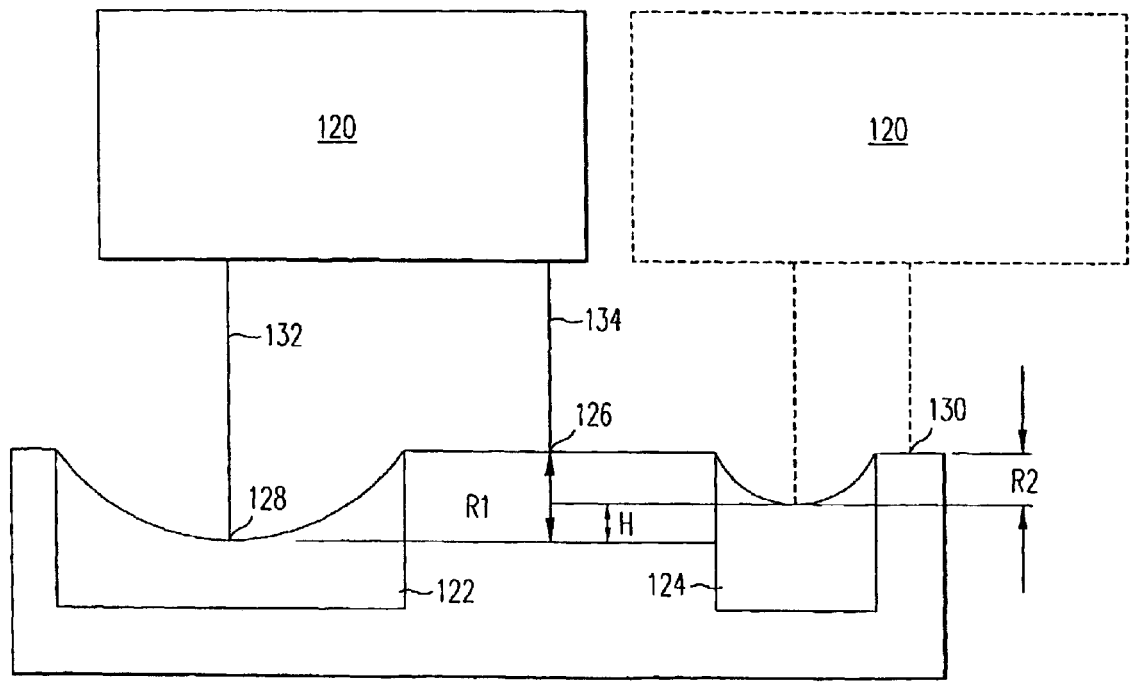
Figure 7C:
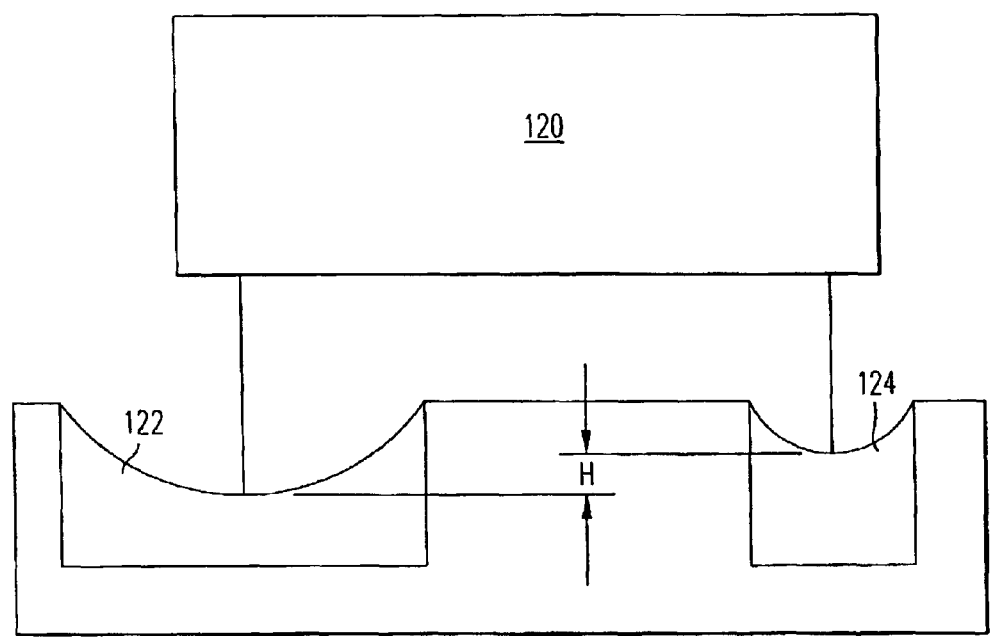

The relative height of a metal line with respect to a second metal line is determined (block 104). FIGS. 7A through 7C, discussed in more detail below, illustrate determining the relative height of a metal line with respect to a second metal line. Once the relative height of a metal line with respect to a second metal line is determined, it is correlated with the calibration data to obtain the dishing value of the desired metal line (block 106).

In one embodiment of the present invention, the width of the metal lines are different, causing the metal lines to dish at different rates. In other embodiments the line widths may be the same and the different rates of dishing may be caused by other parameters, such as different materials used in the lines. In addition, the different dishing rates may be caused by two similar lines, i.e., having the same width and material, being surrounded by two different materials. Moreover, the different dishing rates may be caused by any combination of parameters, such as the lines having different line widths and being composed of different materials. Thus, it should be understood that the present invention measures dishing on a feature based on comparison of the dishing of that feature with respect to another feature having a different dishing rate, and is not limited only to a comparison of features having different widths. Nevertheless, the present disclosure will use features having different widths as an example of different dishing rates for the sake of simplicity.

The relative height between the two metal lines is measured using an appropriate metrology device. One such metrology device is a differential interferometer. As is well known in the art, one type of differential interferometer works by splitting a phase modulated laser beam into two orthogonally polarized components. Each spot then hits the sample at normal incidence with a pre-determined spacing. After reflection from the surface of the sample, the two spots are recombined before hitting a detector. If there is a height difference between the two spots on the sample, there will be a relative change in the phase difference between the two spots upon recombining that will modify the amplitude of the signal hitting the detector. The measured phase shift difference can be converted to a relative height with knowledge of the wavelength of the laser.

Another metrology device that may be used to measure a relative height is a laser displacement sensor. As is well known in the art, a laser displacement sensor focuses a small laser spot onto one location. The position of the reflected beam is then measured. This is repeated with the laser spot focused on a second location. The data can then be converted to a relative height of a metal line with respect to a second metal line.

FIG. 7A shows a cut-away view of the typical resulting structure after a planarization, e.g., CMP, process and the use of a metrology device 120, e.g., a differential interferometer, to take two relative height measurements $R_1$ and $R_2$ of two metal lines 122 and 124 with respect to a single reference location 126. As shown in FIG. 7A, the dishing values of lines 122 and 124 are $R_1$ and $R_2$, respectively. It should be understood that while FIG. 7A shows $R_1$ and $R_2$ as representing the actual dishing values, in practice the measured $R_1$ and $R_2$ will be a relative height that differs from the true height by some phase error. The relative height of wide line 122 with respect to reference location 126 is determined by with an orthogonally polarized component of a phase modulated measurement beam 132 that is incident on line 122 at spot 128. An orthogonally polarized reference beam 134 with a pre-determined spacing from beam 132, is incident at a reference location 126. A relative change in the phase difference between the two beams 132 and 134 upon recombining will modify the amplitude of the signal received by a detector in metrology device 120. The measured phase shift difference can be converted to a relative height $R_1$ with knowledge of the wavelength of the laser. The relative height $R_2$ of narrow line 124 with respect to the reference location 126 is similarly measured using metrology device 120 (shown in dashed lines to indicate its change in position when measuring $R_2$) as shown in FIG. 7A.

FIG. 7B shows metrology device 120 making measurements $R_1$ and $R_2$, however, the relative height measurement $R_2$ is made with respect to a second reference location 130 that should be at the same composition and height as reference location 126. Metrology device 120 is shown in dashed lines to indicate its position at the time $R_2$ is measured.

With measurements taken as described above with reference to FIGS. 7A and 7B, the relative height H of wide line 122 with respect to narrow line 124 can be determined by calculating the difference in the relative height $R_1$ of wide line 122 with respect to reference location 126 and the relative height $R_2$ of narrow line 124 with respect to the reference locations 126 or 130.

$$R_1 - R_2 = H = \Delta\text{Dishing} \quad \text{(Equation 1)}$$

where ΔDishing is the difference in dishing of the wide line 122 and the narrow line 124. While both relative heights $R_1$ and $R_2$ differ from the true heights by some phase error caused by taking the measurements at opaque lines 122 and 124 and at transparent reference locations 126 and 130, the different in relative heights, i.e., H, will be independent of the phase error. Because the metal lines are of different widths, they will dish at different rates. Consequently, H will increase in magnitude as dishing of the metal lines increases. Therefore, H directly correlates to the difference in dishing between the two metal lines.

Alternatively, the relative height H can be determined by directly measuring relative height H of the first line with respect to the second line, as shown in FIG. 7C. Because the measurements are taken directly from the opaque lines 122 and 124, without the use of a transparent reference location, no phase error is introduced. It should be understood, that the present invention is not limited to the embodiments disclosed herein. The methods described with respect to FIGS. 7A through 7C are for illustrative purposes only and any method that determines the relative height of one metal line with respect to a second metal line may be used with the present invention. Once the relative height H is determined, it is then combined with the calibration data to obtain the actual dishing value of an individual metal feature as discussed above in reference to FIG. 6 (block 106).

Figure 8:
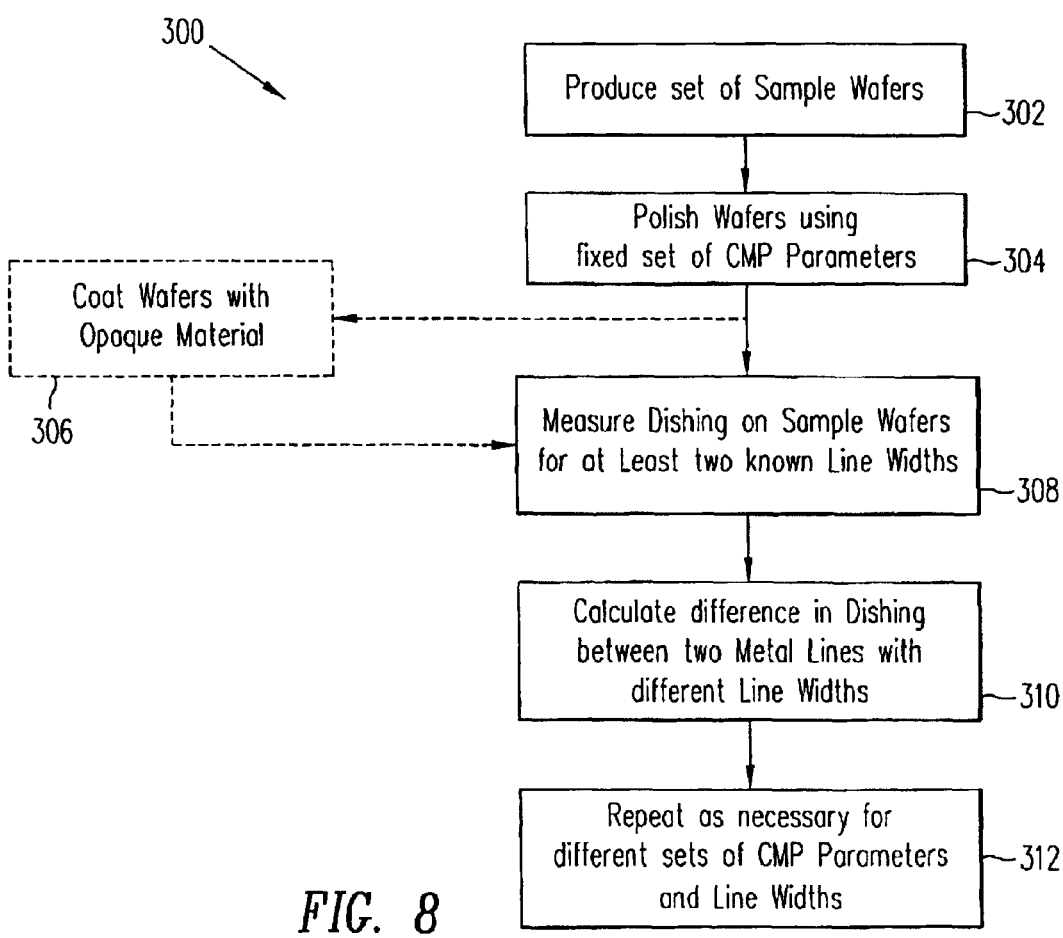
FIG. 8 is a flow chart describing the process of generating a set of calibration data to be used in accordance with the present invention.

FIG. 8 is a flow chart 300 describing the process of generating calibration data in accordance with an embodiment of the present invention. A set of sample wafers or substrates are produced (block 302). Each sample substrate should include a fixed set of parameters, such as different line widths, and ideally should be as close as possible to the production substrate that is to be measured. The sample substrates are planarized in the same manner as the production substrates, e.g., polished using a fixed set of commonly used CMP parameters (block 304). The dishing of the metal lines, of at least two known line widths, caused by the planarization is then independently measured using, e.g., a calibrated atomic force microscope, contact profilometer, or other appropriate device (block 308). The difference between the dishing of two metal lines having different line widths is then calculated (block 310). Again, it should be understood that lines with different line widths are used only as one example lines having different dishing rages. It is not necessary for the metal lines to be of different widths in all embodiments, for example when the metal lines are made of different materials. In addition, if the relative height of a metal line with respect to a second metal line is measured directly, the lines may be surrounded by different materials.

In one embodiment, the dishing is measured using a differential interferometer. Because the dielectric layer is transparent or partially transparent to the wavelength used in conventional differential interferometers, prior to measurement the calibration sample is coated with an adequate thickness, e.g., 40 nm, of an opaque material (block 306), e.g, platinum. The thin layer of opaque material is blanket deposited and thus does not alter the actual height between the metal line and the surrounding dielectric. Thereafter, a measurement of the dishing in the individual metal lines can be made on a differential interferometer (block 308). Block 306, in FIG. 8, is shown in dashed lines to indicate that this is only one embodiment of the current invention. The coating step is not necessary, for example with use of an atomic force microscope.

The calibration data for a specific set of CMP parameters may be generated by plotting the difference in dishing between the metal lines as a function of the dishing of one specific line. However, this is only one example of how the calibration data may be generated. Alternatively, the calibration data may be generated using a software program written by one of ordinary skill in the art in light of this disclosure and implemented by a processor or microprocessor in a well known fashion.

Additional sets of calibration data may be generated using different parameter settings for the CMP process (block 312). The calibration data should be generated with parameters as close as possible to the conditions associated with the production substrates to optimize the capability of the proposed metrology technique. Important CMP parameters that are related to the amount of dishing, for example, include the processing time as well as the ratio of the chemical to the mechanical components of polishing process, such as slurry chemistry and pad composition. The calibration data may be stored, e.g., in a database and accessed during the metrology process.

Figure 9:
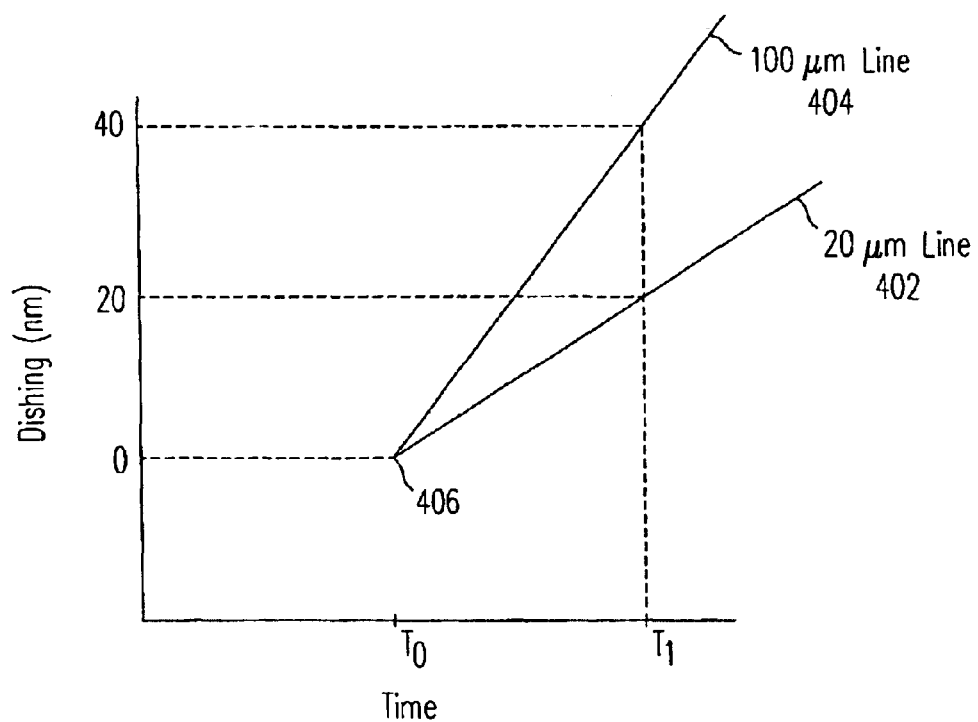
FIG. 9 shows the dishing of 20 μm and 100 μm lines as a function of time.

FIG. 9 is a plot of dishing versus time of planarization processing for metal lines with widths of 20 μm shown as line 402 and 100 μm shown as line 404. As shown in the plot, both lines start at $T_0$ when the metal first becomes planar with the dielectric (the metal clears), and at an identical dishing value of 0. As time progresses dishing increases. However, the wider 100 μm line 404 dishes faster than the 20 μm line 402. The time spent polishing the substrate after the metal has cleared is $T_1-T_0$.

Figure 10:
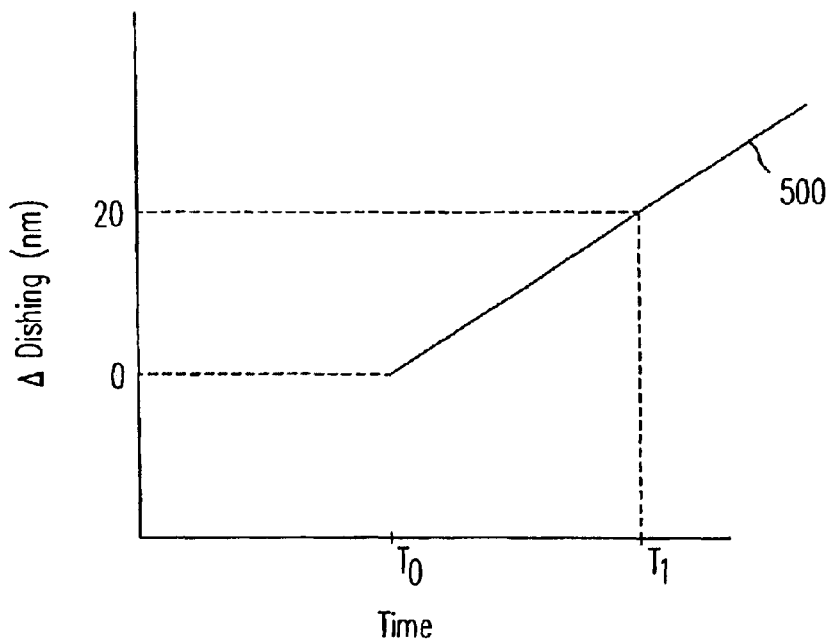
FIG. 10 shows the difference in dishing between a 20 μm and 100 μm line as a function of time.

FIG. 10 is a plot of the difference in dishing 500 between a 20 μm and a 100 μm line versus time, i.e., "H" of equation 1. The x-axis is the same as the one in FIG. 9. As can be seen in FIG. 10, the difference in dishing between the 20 μm and 100 μm lines is 0 at $T_0$ and increases with time.

It should be understood that FIGS. 9 and 10 are conceptual plots of the polishing process. It is not necessary to generate plots of dishing versus time to practice the current invention. These plots are presented for purposes of illustrating the basic concepts of the polishing process.

Figure 11A:
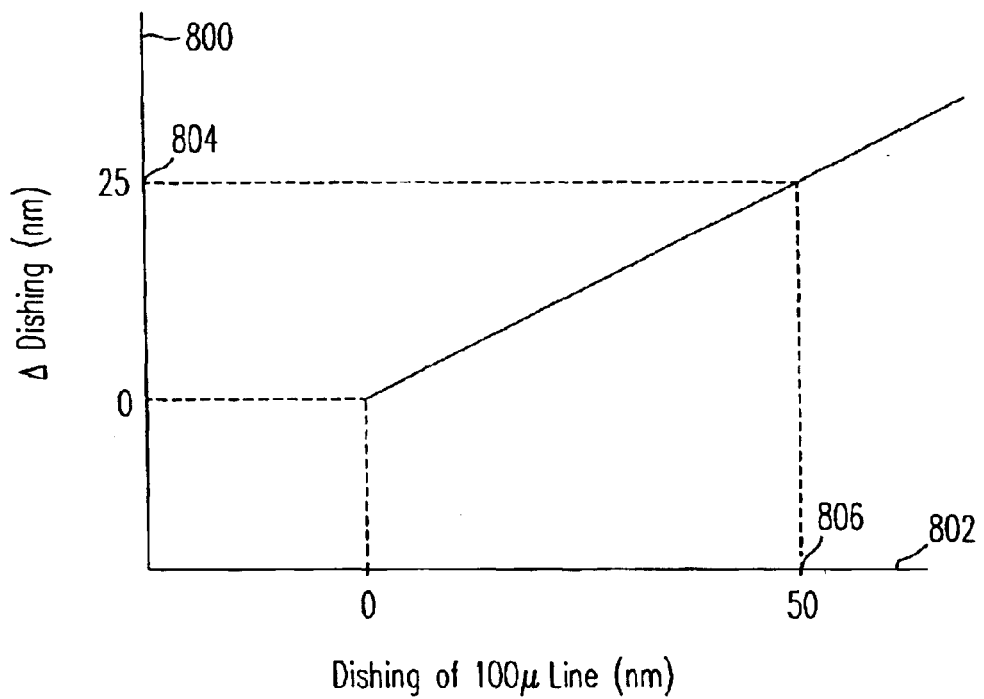
FIG. 11A shows the difference in dishing between a 20 μm and 100 μm line as a function of dishing of the 100 μm line and a relative height measurement (25 nm in this figure), corresponding to a dishing value of the 100 µm line (50 nm on this figure).

FIG. 11A is a plot of calibration data generated in accordance with the present invention for a 100 μm line. The y-axis 800 is the difference in dishing between a 20 μm and a 100 μm line from a calibration sample, and the x-axis 802 is the dishing of a 100 μm line from the calibration sample. The curve starts at 0 difference in dishing and 0 dishing of the 100 μm. This is the point when the metal first clears the dielectric region. The curve then increases monotonically as overpolishing occurs. As discussed above in reference to FIG. 6, to determine the amount of dishing of a 100 μm line from a production sample, e.g., the relative height of a 20 μm line with respect to a 100 μm line on the production sample is determined after a planarization process. As stated above, the relative height H correlates directly with the difference in dishing ΔDishing. Thus, the determined relative height of the 20 μm line with respect to a 100 μm line on the production sample is found on the y-axis 800 of the plot in FIG. 11A. The corresponding dishing of the 100 μm line can then be read off of the x-axis 802. For example, a value of 25 nm 804, of the relative height of the 20 μm line with respect to a 100 μm line, is found on the y-axis 800 of FIG. 11A. This corresponds to a dishing of 50 nm 806 on the x-axis 802. This can be done for any determined value of relative height of the 20 μm line with respect to the 100 μm line, i.e., ΔDishing.

Figure 11B:
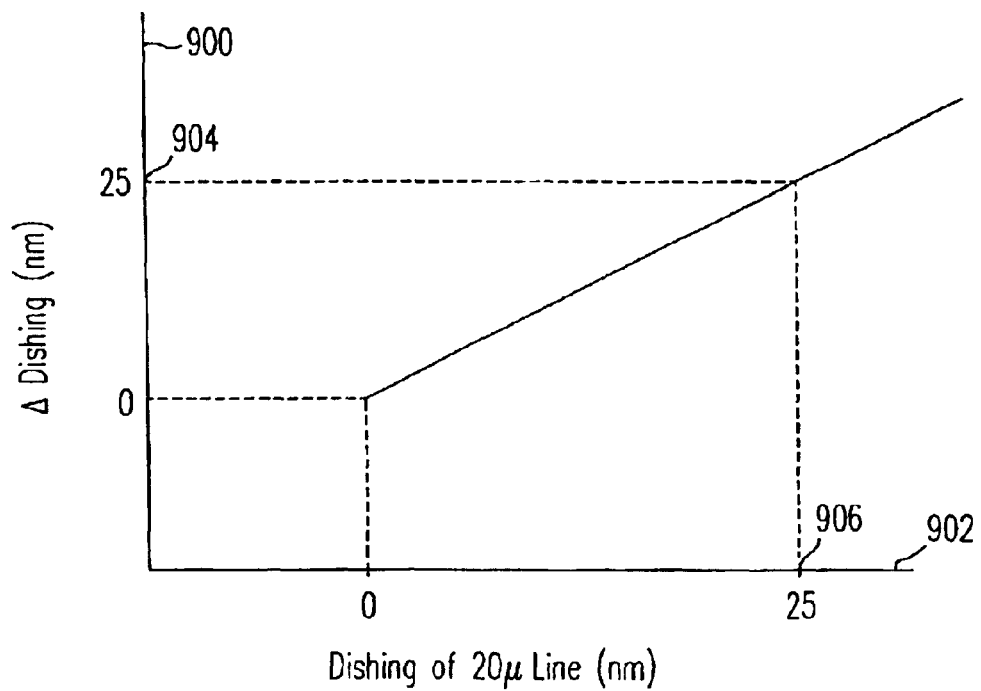
FIG. 11B shows the difference in dishing between a 20 µm and 100 µm line as a function of dishing of the 20 µm line and a relative height measurement (25 nm in this figure), corresponding to a dishing value of the 20 µm line (25 nm on this figure).

FIG. 11B is similar to FIG. 11A, however it is an example of a calibration plot for a 20 μm line. As discussed above a relative height of a metal line with respect to a second metal line is determined for the production sample, e.g., the relative height of a 20 μm line with respect to a 100 μm line, after a planarization process. The relative height of the 20 μm line with respect to a 100 μm line can then be found on the y-axis 900 of the plot in FIG. 11B. The corresponding dishing of the 20 μm line can then be read off of the x-axis 902. For example, a value of 25 nm 904 of the relative height of the 20 μm line with respect to a 100 μm line is found on the y-axis 900 of FIG. 11B. This corresponds to a dishing of 25 n m 906 for the 20 μm line.

Preferably, the calibration data should encompass the expected dishing values on the production substrates so that the dishing values may be interpolated. However, the dishing values may also be extrapolated, although this technique may produce some inaccuracies. A minimum of two values is used for the calibration plots with a straight line drawn through the two points. Three or more calibration points may be used with a least square fit through the points. It is expected that the behavior will be linear, but it may not be and a polynomial fit may be preferred. The physics associated with the polishing process will impact the slope and shape of these calibration curves. For example, the CMP process may be implemented with a slurry or fixed abrasive, or a different planarization process may be substituted for the CMP process, e.g., chemical polishing, all of which will modify the calibration curves.

It should be understood that while the present disclosure describes physically plotting the curves of the difference in dishing versus dishing of an individual metal line, this is intended to describe the mathematical manipulation of the data, for example, using a processor or microprocessor. Thus, the generation of the curve representing the difference in dishing versus actual dishing can be performed mathematically, for example using software implemented by a processor. Additionally, the calibration data is described in the disclosure as the difference in dishing between a first calibration feature, that has approximately the same dishing rate as a first feature on a production substrate, and a second calibration feature, having approximately the same dishing rate as a second feature on a production substrate, with respect to the dishing of the first calibration feature. However, this is only one embodiment of the current invention and the calibration data is not limited thereto. Any calibration data that performs the same function to obtain the same result may be used.

Although the present invention is illustrated in connection with specific embodiments for instructional purposes, the present invention is not limited thereto. Various adaptations and modifications may be made without departing from the scope of the invention. For example, the inlaid metal features may be made of copper, aluminum, tungsten or any other appropriate metal or metal alloy, as well as non-metal material. Additionally, the lines have different dishing rates, but do not necessarily have to be of different widths. They may be of the same width but made of different material, or as long as the relative height difference is measured directly they may be of the same material and width and surrounded by different material. Further, while the lines are sometimes described as isolated in the present disclosure, it should be understood that the lines need not be completely isolated. For example, if the lines being measured have similar isolation characteristics, the present invention may be usefull. The metrology process in accordance with the present invention is not limited to measuring dishing after a CMP process, but may be used after any process where dishing takes place. Moreover, it should be understood that a metrology process may be used with wafers, flat panel displays or any other device in which the measurement of dishing is desirable. Further, while the disclosure shows that the relative height and line width measurements are plotted graphically, it should be understood that the data may be stored in a computer readable medium and manipulated mathematically using, e.g., an appropriate processor or microprocessor reading software, which may be written by one of ordinary skill in the art in light of the present disclosure. Therefore, the spirit and scope of the appended claims should not be limited to the foregoing description.

What is claimed is:

1. A method of generating a set of calibration data for correlating the relative height of a first feature with respect to a second feature with the difference in dishing between a first calibration feature and a second calibration feature with respect to said dishing of said first calibration feature, wherein said first calibration feature has approximately the same dishing rate as said first feature and said second calibration feature has approximately the same dishing rate as said second feature, said method comprising:

providing a sample substrate having said first calibration feature of a first material surrounded by a second material and having said second calibration feature, wherein said first calibration feature and said second calibration feature have different dishing rates;.

processing said sample substrate to produce dishing of said first and second calibration features;

measuring actual dishing values of said first and second calibration features;

calculating a difference in actual dishing values between said first and second calibration features; and producing calibration data by relating said difference in actual dishing values between said first and second calibration features to the actual dishing of said first calibration feature.

2. The method of claim 1, further comprising coating said sample substrate with an opaque material prior to measuring actual dishing values.

3. The method of claim 2, wherein said measuring actual dishing values is done with one of a differential interferometer, atomic force microscope, and contact profilometer.

4. The method of claim 2, wherein said opaque material is platinum.

5. The method of claim 1, wherein said processing said sample substrate comprises polishing said sample substrate.

6. The method of claim 1, further comprising plotting a curve of said difference in actual dishing values versus said actual dishing values of said first calibration feature.

7. A method of generating a set of calibration data, said method comprising:

providing a sample substrate having a first calibration feature of a first material surrounded by a second material and having a second calibration feature, wherein said first calibration feature and said second calibration feature have different amounts of dishing;

measuring actual dishing values of said first calibration feature and said second calibration feature;

determining the relationship in actual dishing values of said first calibration feature and said second calibration feature; and producing calibration data by relating said relationship in actual dishing values of said first calibration feature and said second calibration feature to the actual dishing of said first calibration feature.

8. The method of claim 7, further comprising coating said sample substrate with an opaque material prior to measuring actual dishing values.

9. The method of claim 8, wherein said measuring actual dishing values is done with one of a differential interferometer, atomic force microscope, and contact profilometer.

10. The method of claim 8, wherein said opaque material is platinum.

11. The method of claim 7, wherein said processing said sample substrate comprises polishing said sample substrate.

12. The method of claim 7, further comprising plotting a curve of said difference in actual dishing values versus said actual dishing values of said first calibration feature.

13. The method of claim 7, wherein said determining the relationship in actual dishing values comprises calculating the difference in actual dishing values between said first calibration feature and said second calibration feature.

* * * * *